(12) United States Patent
Yang et al.

(10) Patent No.: US 6,384,482 B1
(45) Date of Patent: May 7, 2002

(54) METHOD FOR FORMING A DIELECTRIC LAYER IN A SEMICONDUCTOR DEVICE BY USING ETCH STOP LAYERS

(75) Inventors: Chih-Sheng Yang, Taipei; Kuei-chang Tsai, Tai Chung; Chih-hung Shu, Hsinchu; Yun-liang Ouyang, Taipei, all of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/929,098

(22) Filed: Aug. 15, 2001

(30) Foreign Application Priority Data

Nov. 3, 2000 (TW) .......................................... 89123321

(51) Int. Cl.⁷ ...................... H01L 23/48; H01L 21/4763
(52) U.S. Cl. ...................... 257/758; 257/760; 438/624; 438/633; 438/634
(58) Field of Search .............................. 257/752, 758, 257/760; 438/624, 626, 633, 634

(56) References Cited

U.S. PATENT DOCUMENTS

| 5,560,802 A | * | 10/1996 | Chisholm ................ 156/636.1 |
| 6,069,069 A | * | 5/2000 | Chooi et al. ................. 438/634 |
| 6,180,489 B1 | * | 1/2001 | Wang et al. ................. 438/424 |
| 6,218,285 B1 | * | 4/2001 | Lou ............................ 438/624 |
| 6,258,711 B1 | * | 7/2001 | Laursen ....................... 438/633 |

* cited by examiner

Primary Examiner—T. N. Quach
(74) Attorney, Agent, or Firm—Birch, Stewart, Kolasch & Birch, LLP

(57) ABSTRACT

The invention provides a method for forming a dielectric layer in a semiconductor device by using etch stop layers, and a semiconductor structure formed by the method. The method in accordance with the invention comprises: providing a semiconductor substrate having raised portions and recessed portions; forming a first etch stop layer covering the raised portions and the recessed portions; forming a dielectric layer covering an upper surface of the first etch stop layer, wherein the dielectric layer has a thickness substantially smaller than that of each of the raised portions; forming a second etch stop layer covering the dielectric layer; and performing a planarizing step for polishing the second etch stop layer and the dielectric layer until exposing the first etch stop layer on an upper surface of the raised portions, and remaining a plurality of remaining portions of the second etch stop layer on the planarized surface, and remaining the dielectric layer between raised portions.

8 Claims, 2 Drawing Sheets

METHOD FOR FORMING A DIELECTRIC LAYER IN A SEMICONDUCTOR DEVICE BY USING ETCH STOP LAYERS

BACKGROUND OF THE INVENTION

1. Field of the Invention:

The invention relates to a method for forming a semiconductor device, and more particularly, to a method for forming a dielectric layer in a semiconductor device by using etch stop layers, and a semiconductor structure formed by the method.

2. Description of the Related Art:

In integrated circuits, devices formed in a semiconductor substrate are generally coupled by a system of metallized interconnect. Typically, the manufacturing process is to deposit aluminum or other metal on the semiconductor substrate, and then pattern the deposited metal to form the interconnect. FIG. 1 shows a typical semiconductor substrate 10 with raised portions such as metal lines 12 formed thereon. A dielectric layer 14 is then formed on the metal lines 12 (first metal lines), as shown in FIG. 2. In most processes, via holes (not shown) are etched through the dielectric layer 14, and then second metal lines (not shown) is formed over the dielectric layer 14. The second metal lines cover the dielectric layer 14 and fill into the via holes to be electrically connected to the first metal lines 12. The dielectric layer 14 is for insulation between the first metal lines 12 and the second metal lines.

The inter-metal dielectric layer 14 often includes silicon dioxide formed by chemical vapor deposition (CVD). The dielectric layer 14 covers the first metal lines 12 conformably so that the upper surface of the dielectric layer 14 becomes non-planar steps which correspond to the shape of the first metal lines 12.

The steps in the upper surface of the dielectric layer 14 have several undesirable features. For example, a non-planar surface of the dielectric layer 14 has adverse effects on subsequent photolithographic processes; thereby it deteriorates the optical resolution. In addition, non-planar surface of the dielectric layer 14 interferes with the step coverage of the second metal lines. If the step height is too large, it is possible that the bad step coverage will result in open circuits being formed in the second metal lines.

To solve these problems, one approach is known as chemical mechanical polishing (CMP). The polishing method employs an abrasive chemical to remove protruding steps along the upper surface of the dielectric layer 14 and thus planarizes the steps. The dielectric layer 14 is planarized to form a planarized dielectric layer 14a as shown in FIG. 3.

However, current planarizing methods are still limited. For example, if a manufacturing process requires to polish a dielectric layer, which is above the metal lines, to a remaining thickness of about 1200 to 2500 Å, for instance, it is required that the thickness of dielectric layer between metal lines to be controlled to around 2000 Å in manufacturing a magnetic random access memory (MRAM), the CMP will easily turn to a failure as the metal lines are subject to be polished. This is because the process window of the polishing is small, for example, polishing rate of the silicon dioxide layer is about 3000 Å/min, and thus it is not easy to control the thickness to be polished. Besides, the CMP easily causes defects such as dishing phenomenon.

SUMMARY OF THE INVENTION

An object of the invention is to solve the above-mentioned problems. The invention provides a method for forming a dielectric layer in a semiconductor device by using etch stop layers, and a semiconductor structure formed by the method.

The method for forming a dielectric layer in a semiconductor device in accordance with the invention comprises the steps of: providing a semiconductor substrate having raised portions and recessed portions thereon; forming a first etch stop layer on the raised portions and recessed portions; forming a dielectric layer on the first etch stop layer, wherein the dielectric layer has a thickness substantially smaller than that of the raised portions; forming a second etch stop layer on the dielectric layer; and performing a planarizing step for polishing the second etch stop layer and the dielectric layer until exposing the first etch stop layer over the raised portions, and at the same time remaining a plurality of remaining portions of the second etch stop layer on the planarized surface and remaining the dielectric layer between raised portions.

A semiconductor structure having a dielectric layer formed by the method of the invention comprises: a semiconductor substrate having raised portions and recessed portions; a first etch stop layer conformably formed on the raised portions and recessed portions; a plurality of dielectric layers each formed on the first etch stop layer between raised portions, wherein each of the plurality of dielectric layers has a thickness substantially smaller than that of each of the raised portions; and a plurality of remaining portions of a second etch stop layer respectively on each of the dielectric layers, and each of their upper surfaces substantially flush with an upper surface of the first etch stop layer.

In the method of the invention, it is easy to control the extent of the polishing process by using two etch stop layers. That is, since the process window of the method of the invention is larger than that of the prior art, the process can be easily controlled and can lower operation costs and increase production yield.

DESCRIPTION OF THE PREFERRED EMBODIMENT

The method for forming a dielectric layer in a semiconductor device in accordance with the invention will be described with reference to FIGS. 4 through 8.

Figure 1:
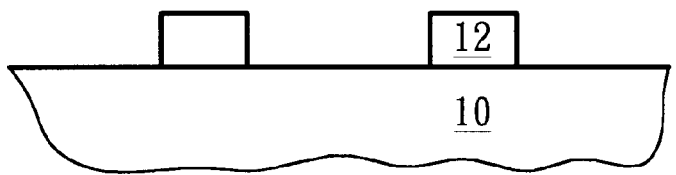
FIGS. 1 to 3 are sectional views showing sequential steps of a conventional method for forming a dielectric layer in a semiconductor device.
Figure 2:
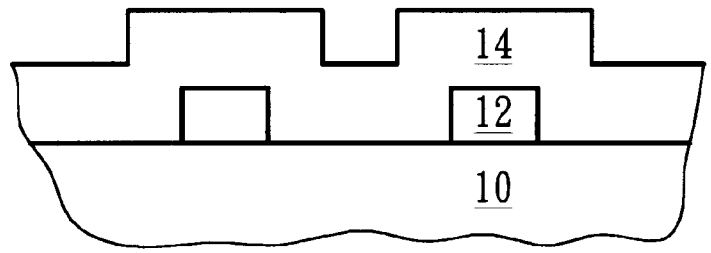
Figure 3:
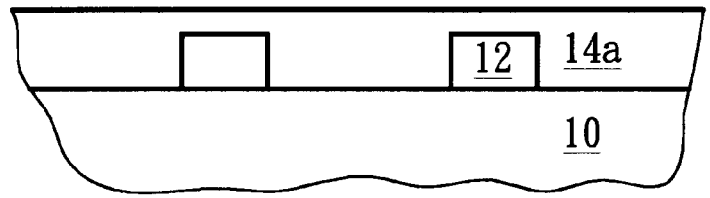
Figure 4:
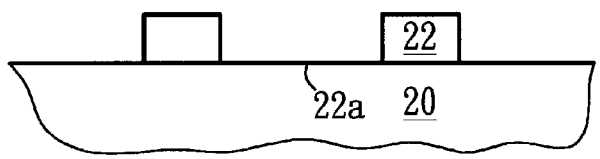
FIGS. 4 to 8 are sectional views showing sequential steps of a method of the invention for forming a dielectric layer in a semiconductor device.
Figure 5:
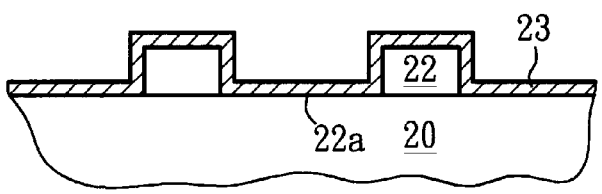

First, as shown in FIG. 4, a semiconductor substrate 20 is provided with raised portions 22 relative to a surface 22a of the semiconductor substrate 20. The raised portions 22 can be metal lines. A first etch stop layer 23 is then formed on the surface 22a and raised portions 22 conformably, as shown in FIG. 5. The first etch stop layer 23 is preferred being formed by silicon nitride or silicon oxynitride with a thickness ranging from 2000 to 3000 Å.

Figure 6:
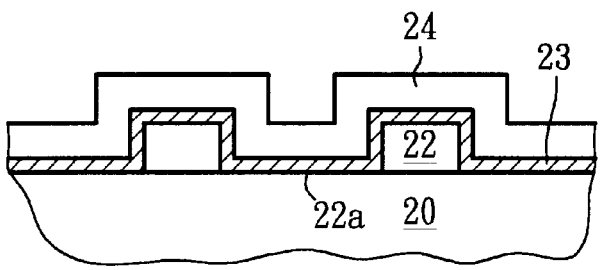
Figure 7:
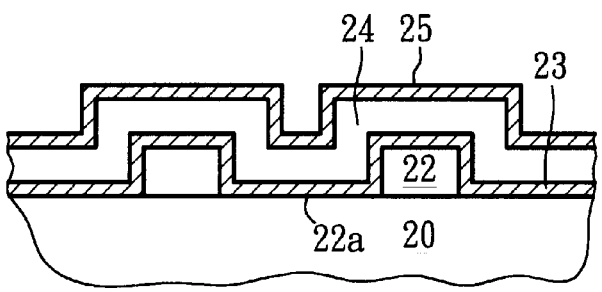

A dielectric layer 24 is then formed conformably on an upper surface of the first etch stop layer 23, as shown in FIG. 6. The dielectric layer 24 can be a silicon dioxide layer formed by such as chemical vapor deposition, and thus formed dielectric layer 24 has a thickness substantially smaller than that of the raised portions 22. In this case, a difference between the thickness of dielectric layer 24 and raised portions 22 equals to about the thickness of the first etch stop layer 23, that is, about 2000 to 3000 Å. Next, as shown in FIG. 7, a second etch stop layer 25 is formed conformably on the dielectric layer 24. The second etch stop layer 25 is preferred being formed by silicon nitride or silicon oxynitride.

Next, a planarizing step is performed to polish the second etch stop layer 25 and dielectric layer 24 until the first etch stop layer 23 over the raised portions 22 is exposed. In this case, a plurality of remaining portions 25a of the second etch stop layer are remained on the planarized surface. Besides, the polished dielectric layer 24 remains only portions between raised portions 22, which are dielectric layer 24a shown in FIG. 8.

Figure 8:
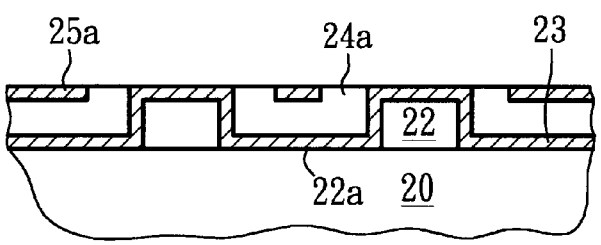

Therefore, a semiconductor structure, as shown in FIG. 8, formed by the method of the invention comprises: a semiconductor substrate 20 having raised portions 22 such as metal lines and recessed portions such as an upper surface 22a of the semiconductor substrate 20; a first etch stop layer 23 conformably covering the raised portions 22 and the surface 22a; a plurality of dielectric layer 24a each covering an upper surface of the first etch stop layer 23 between the raised portions 22, wherein the thickness of each of the plurality of dielectric layer 24a is substantially smaller than that of each of the raised portions 22, the difference of thickness of the plurality of dielectric layer 24a and the raised portions 22 substantially equals to the thickness of the first etch stop layer 23; and a plurality of remaining portions 25a of the second etch stop layer, wherein each of the remaining portions 25a is on respective dielectric layer 24 with its upper surface substantially flushing with and an upper surface of the first etch stop layer 23.

In this case, in the semiconductor structure of the invention, the first etch stop layer 23 is preferred being formed by silicon nitride or silicon oxynitride and having a thickness ranging from 2000 to 3000 Å. Besides, the second etch stop layer 25 is preferred being formed by silicon nitride or silicon oxynitride and having a thickness determined by practical pattern design, generally ranging from 2000 to 4000 Å. Each of the dielectric layers 24 can be a silicon dioxide layer formed by such as chemical vapor deposition.

The method of the invention employs the first etch stop layer 23 and the second etch stop layer 25 in order to control polishing rate. Since polishing rate of silicon nitride or silicon oxynitride is about 2.5 times slower than that of dielectrics such as silicon dioxide, it is easier than in prior art to control the thickness to be polished. Therefore, the method can prevent defects such as dishing phenomenon or failures due to polishing to the metal lines. Therefore, when the method of the invention is used to form a semiconductor device, since its process window is large, the process can be easily controlled. Besides, since the thickness of the dielectric layer can be thinner than in prior art, the method of the invention can lower operation costs and increase production yield.

While the present invention has been particularly described, in conjunction with a specific example, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming a dielectric layer in a semiconductor device, comprising the steps of:

providing a semiconductor substrate having raised portions and recessed portions thereon;

forming a first etch stop layer covering said raised portions and recessed portions;

forming a dielectric layer over an upper surface of said first etch stop layer, wherein said dielectric layer has a thickness substantially smaller than that of each of said raised portions;

forming a second etch stop layer over said dielectric layer; and performing a planarizing step for polishing said second etch stop layer and said dielectric layer until exposing said first etch stop layer on an upper surface of said raised portions, and remaining a plurality of remaining portions of said second etch stop layer on the planarized surface, and remaining said dielectric layer between said raised portions.

2. The method of claim 1, wherein said first etch stop layer is made by a material selected from a group consisting of silicon nitride and silicon oxynitride, and said first etch stop layer has a thickness ranging from 2000 to 3000 Å.

3. The method of claim 1, wherein said dielectric layer is a silicon dioxide layer formed by chemical vapor deposition.

4. A semiconductor structure, comprising:

a semiconductor substrate having raised portions and recessed portions;

a first etch stop layer conformably covering said raised portions and recessed portions;

a plurality of dielectric layer each covering an upper surface of said first etch stop layer between said raised portions, wherein each of said plurality of dielectric layer has a thickness substantially smaller than that of each of said raised portions; and a plurality of remaining portions of a second etch stop layer each covering a respective dielectric layer, and each remaining portion has an upper surface substantially flushing with an upper surface of said first etch stop layer.

5. The semiconductor structure of claim 4, wherein said first etch stop layer is made by a material selected from a group consisting of silicon nitride and silicon oxynitride, and said first etch stop layer has a thickness ranging from 2000 to 3000 Å.

6. The semiconductor structure of claim 4, wherein said second etch stop layer is made by a material selected from a group consisting of silicon nitride and silicon oxynitride.

7. The semiconductor structure of claim 4, wherein said dielectric layer is a silicon dioxide layer formed by chemical vapor deposition.

8. The semiconductor structure of claim 4, wherein a difference of thickness between said dielectric layer and said raised portions equals to about the thickness of said first etch stop layer.

* * * * *